United States Patent [19]

Kawakami et al.

[11] Patent Number: 5,106,462
[45] Date of Patent: Apr. 21, 1992

[54] PROCESS OF PRODUCING COPPER PLATED RESIN ARTICLE

[75] Inventors: Takamasa Kawakami; Rieko Nakano; Kazuhiro Ando; Ryuji Fujiura, all of Niigata, Japan

[73] Assignee: Mitsubishi Gas Chemical Co., Inc., Tokyo, Japan

[21] Appl. No.: 432,811

[22] Filed: Nov. 7, 1989

[30] Foreign Application Priority Data

| Nov. 7, 1988 | [JP] | Japan | 63-279394 |
| Mar. 6, 1989 | [JP] | Japan | 1-52095 |
| May 18, 1989 | [JP] | Japan | 1-122936 |
| May 18, 1989 | [JP] | Japan | 1-122938 |

[51] Int. Cl.$^5$ ............................................. C23C 28/00
[52] U.S. Cl. ........................................ 205/164; 427/96; 427/97; 427/229; 427/252; 205/184; 205/927
[58] Field of Search .............. 427/229, 250, 252, 96, 427/97; 204/38.4

[56] References Cited

U.S. PATENT DOCUMENTS 4,913,938 4/1990 Kawakami et al. ............. 427/383.1

FOREIGN PATENT DOCUMENTS 0322764 5/1989 European Pat. Off. .

OTHER PUBLICATIONS

Soviet Inventions Illustrated, week B26, Aug. 8, 1979, section Chemical, abstract No. 486528/26, Derwent Publications Ltd., London, GB; SU-A-621 801 (Ermolaev, . RMOLAV VI.) Jul. 21, 1978.
Soviet Inventions Illustrated, week Y23, Jul. 19, 1977, G 02, abstract No. 4111Y/23, Derwent Publication Ltd., London, GB; & SU-A-523 963 (AS Ukr Water Chem.) Oct. 22, 1976.

Primary Examiner—John F. Niebling
Assistant Examiner—William T. Leader
Attorney, Agent, or Firm—Sughrue, Mion, Zinn, Macpeak & Seas

[57] ABSTRACT

Process for producing a copper plated resin article by forming a uniform copper coating having excellent adhesive strength on a fiber-reinforced or unreinforced thermoplastic or thermosetting resin article having a heat deformation temperature higher than 165° C. The resin article is heated along with a source of copper formate under a reduced pressure or in a non-oxidative atmosphere to a temperature in the range above 165° C. but lower than the heat deformation temperature of the resin article. The process makes it possible to produce a resin article having formed thereon a copper layer having an excellent adhesive strength by a very simple manner, and the resin article thus obtained can be used in various industrial fields.

39 Claims, 2 Drawing Sheets

PROCESS OF PRODUCING COPPER PLATED RESIN ARTICLE

FIELD OF THE INVENTION

This invention relates to a process of producing a copper plated resin article by forming a uniform copper coating having excellent adhesive strength on a fiber-reinforced or unreinforced thermoplastic or thermosetting resin article having a heat deformation temperature higher than 165° C., and the copper plated resin article thus produced.

The copper plated resin article of this invention has a copper film or layer strongly and uniformly formed even in grooves, hole, etc., and can be used as it is or as a base material for plating of other metal for various uses, such as frames of glasses, knobs, injection-molded plates for printed circuits, other resin moldings, films, sheets, laminates, plated through hole materials, etc.

BACKGROUND OF THE INVENTION

As a process of forming a copper coating on a resin article as an electrically insulating article, an electroless plating method, a vapor deposition method, a press-contact method, an adhesion by an adhesive, etc., are conventionally known.

The electroless plating method is most general and has been practically used in many technical fields, and is an excellent plating method since low-temperature plating is applicable. However, this plating method usually requires a specific pre-treatment and in the method, there are troublesome problems such as the use of specific chemicals, a long time plating treatment, a waste liquid treatment, etc.

For omitting or simplifying the pre-treatment step, there is a method of using a resin article made of a composition previously compounded with dienic rubber, etc., but it frequently happens that the properties of the resin itself are deteriorated. Further, in the case of resin molding compounded with a reinforcing material such as glass fibers, etc., or a filler, it is difficult to apply a strongly adhesive good plating to the surface of the reinforcing material, which results in causing a disadvantage that the plating is easily peeled off at the portion where the reinforcing material is exposed on the surface of the molding.

As the vapor deposition method, there are known a vacuum vapor deposition method, an ion sputtering method, an ion plating method, etc., and in these methods, a specific equipment such as high-vacuum apparatus is used for the vapor deposition and also a specific pre-treatment is usually required for improving the adhesive property, but there is a disadvantage that the adhesive strength is generally inferior.

Furthermore, a press-contact method, adhesion by an adhesive, etc., can be properly used, but in these cases, the press-adhesion is inapplicable for some articles or there is a restriction on the form of resin articles for which the above method is applicable. In the case of the adhesion method, a previously produced copper foil is used, and therefore, the thickness and size of the copper foil and the kind of the adhesive are restricted and, in particular, the property of the adhesive layer greatly influences on the property of the adhered product.

Still further, it is known that when copper formate is coated on a ceramic and the ceramic is heat-treated in a non-oxidative atmosphere, an article having adhered thereto a copper coating is obtained but in the method, it is difficult to produce articles having strongly adhered thereto a copper coating with good reliability. This method has never been applied to thermoplastic resin or thermosetting resin articles and for these resin articles, the above-described electroless plating method has been mainly used.

A copper clad film prepared by adhering a copper foil onto a film or sheet of a heat-resistant resin such as polyimide resin, etc., has been used, but recently a so-called "double layer film" having a strongly adhered copper coating without using an adhesive inferior in properties such as heat resistance, etc., has been required in the field of electronic materials. However, as described above, a method of forming a copper layer or film on a polyimide film, etc., strongly adhered thereto by a simple and economical manner without using adhesives has not yet been developed.

In the fields of double faced copper clad plates, multi-layer printed wiring boards, etc., having through holes, it has been required to use through holes for interlaminar electro-conducting only using from through holes having a diameter of 0.8 mm or less to small holes having a diameter of 0.35 mm or less from the standpoints of development of small-sized parts and surface mounting techniques.

However, in through hole plating by an electroless plating method conventionally practiced, the plating liquid does not permeate into the inside of small holes having a diameter of about 0.35 mm and fluidity becomes difficult since the electroless plating liquid is a liquid, thereby becoming very difficult to form a uniform copper film or layer on the inside walls of the holes.

In other words, a process of economically forming a copper layer or film having an excellent adhesive strength and a high quality on steric moldings, films, sheets, laminates, etc., of resins by a simple manner has been desired.

SUMMARY OF THE INVENTION

As the result of various investigations on a process of forming a strongly adhered copper film or layer on a polyimide article without using an adhesive, the inventors have found a possibility of overcoming the above-described problems by using copper formate and after further investigating the possibility, the inventors have succeeded in accomplishing the present invention.

Accordingly, an object of the present invention is to provide a process of producing a copper plated resin article wherein a copper coating is strongly adhered on the resin article.

DETAILED DESCRIPTION OF THE INVENTION

Figure 1:
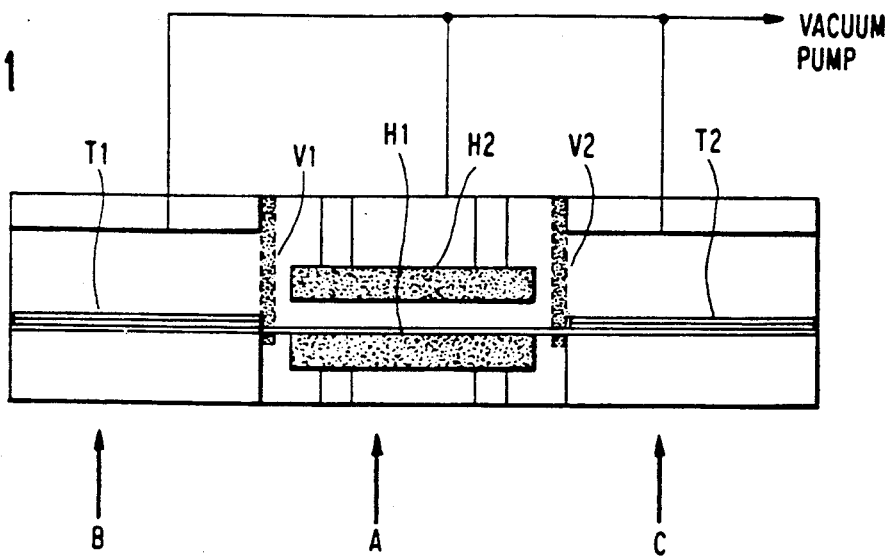
FIG. 1 is a schematic view showing an example of an apparatus for performing copper plating by the semi-continuous process of this invention.

The first embodiment of the invention is a process of producing a copper plated resin article by forming a copper film or layer strongly adhered to the resin article by a dry process, which comprises heating a resin article having a heat deformation temperature higher than 165° C. and copper formate under a reduced pressure or in a non-oxidative atmosphere in such a manner that the resin article is heated to a predetermined temperature in the range of at least 165° C. and lower than the heat deformation temperature of the resin article and the copper formate is temperature-raised at a rate of at least 1° C./min in the temperature range of at least from 130° C. to 165° C., and keeping the resin article and copper formate at a temperature of at least 165° C.

In the first embodiment, the amount of copper formate used is at least 0.001 g/cm$^2$, and preferably from 0.003 to 0.3 g/cm$^2$, per the whole area of the plating zone for heat-treating the resin article and copper formate, the temperature-raising rate of copper formate between 130° C. and 165° C. is from 1° to 50° C./min, the temperature of keeping copper formate by heating is from 170° C. to 300° C., the keeping time is selected from the range of from 1 minute to 60 minutes, the heat treatment is performed at a reduced pressure of 30 Torr or less, and preferably 5 Torr or less, the resin article is an article washed and dried (i.e., surface cleaning treatment, and hereinafter the same), and the resin article and copper formate are continuously or intermittently supplied to a heating zone previously heated to a predetermined temperature and took out from the heating zone.

The copper layer formed shows an excellent adhesive property such that in a cross cut test of forming 11 cross cuts with an interval of 1 mm, sticking an adhesive tape thereto, and peeling off the tape, the copper are all not peeled off at 100/100.

Furthermore, a copper-plated resin product is then subjected to electroplating. The electroplating is a copper electroplating, the plating is applied at a plating rate of 0.1 μm/sec or less until the thickness of the copper layer becomes 5 μm or more, and the copper foil peeling strength when the copper-plated resin product is copper-electroplated at a copper layer thickness of 10 μm is at least 0.4 kg/cm, and preferably at least 0.5 kg/cm.

The second embodiment of this invention is a process of producing a copper-plated article which comprises using a fiber-reinforced or unreinforced heat-resistant resin molding (1) having a heat deformation temperature higher than 165° C. as the resin article, heating the molding (1) and copper formate at a reduced pressure of 30 Torr or less, and preferably 5 Torr or less in such a manner that the molding (1) is heated to a predetermined temperature in the range of at least 165° C. and lower than the heat deformation temperature of the molding and the copper formate is temperature-raised at a rate of at least 1° C./min in the temperature range of at least from 130° C. to 165° C., and keeping the molding and copper formate at a temperature of at least 165° C.

In the second embodiment, the molding (1) copper-plated is an article previously washed and dried, the amount of copper formate is at least 0.001 g/cm$^2$, and preferably from 0.003 to 0.3 g/cm$^2$, per the whole area of the plating zone for heat-treating the molding (1). A solution or dispersion of copper formate is applied to a desired portion of the molding (1), followed by drying to a desired portion of the molding (1), followed by drying at a temperature of 130° C. or less, and the copper plating is performed on the copper formate-attached molding (1). The dispersion of copper formate is a dispersion formed by dispersing a fine powder of anhydrous copper formate in an organic solvent having a boiling point of 200° C. or less, and the copper plating is performed by placing many copper formate-attached moldings (1) in a vessel or disposing the same on a disposing means.

In the second process of producing copper-plated molding (1), the copper plating is performed by separately disposing the molding (1) and copper formate at an interval within 5 cm under a reduced pressure, the copper plating is performed by placing many moldings (1) in a vessel or on a disposing means and also disposing copper formate on the inside surface of a lid for the vessel or on the disposing means, the copper formate is disposed at the contact portions of moldings (1) each other formed when the moldings (1) are disposed in the vessel or on the disposing means or the contact portions between the moldings (1), and the vessel or the disposing means is in contact with the moldings (1).

The third embodiment of this invention is a process of producing a copper clad base plate having a copper layer of from 0.1 to 5 μm closely adhered thereto, which comprises disposing or holding a base plate (2) selected from a heat resistant resin film or sheet (2-1) having a heat deformation temperature higher than 165° C. and a thermosetting resin laminate (2—2) having a heat deformation temperature higher than 165° C. and copper formate with an interval within 5 cm at a reduced pressure of 30 Torr or less, and preferably 5 Torr or less, heating the base plate (2) to a predetermined temperature in the range of at least 165° C. and lower than the heat deformation temperature of the base plate (2), and raising the temperature of copper formate at a rate of at least 1° C./min. in the temperature range of at least from 130° C. to 165° C.

In the third process of producing a copper-plated base plate, the base plate (2) is previously washed and dried, the amount of copper formate is at least 0.001 g/cm$^2$, and preferably from 0.003 to 0.3 g/cm$^2$, per the whole area of the plating zone for heat-treating the base plate (2) and copper formate, the base plate (2) has a large number of perforations at desired portions, the base plate (2) is a polyimide film or a thermosetting resin laminate, and these base plates (2) are continuously or intermittently supplied to the heating zone pre-heated to a predetermined temperature under a reduced pressure and took out from the heating zone.

The fourth embodiment of this invention is a process of producing a plated through hole material, which comprises forming a large number of through holes in a copper clad plate or a multilayer board having printed wiring in the inside layer thereof, the plate and board each having a heat deformation temperature higher than 165° C. to form a through hole base plate (3), disposing or holding copper formate at a position within 5 cm of the through holes, heating the through hole base plate (3) to a predetermined temperature in the range of at least 165° C. and lower than the heat deformation temperature of the through hole base plate (3) at a reduced pressure of 30 Torr or less, and preferably 5 Torr or less, and raising the temperature of copper formate at a rate of at least 1° C./min. up to at least the temperature range of from 130° C. to 165° C. and keeping copper formate at a temperature of at least 165° C.

In the fourth process of producing a plated through hole material, the through hole plates (3) are continuously or intermittently supplied to the heating zone pre-heated to a predetermined temperature at a reduced pressure and took out from the heating zone, the through hole base plate (3) and copper formate are supplied in a constitution of superposing the through hole base plate (3) on a plate having coated thereon or spread thereover a thin layer of copper formate through a thin partition piece in at least the peripheral portion of the through hole base plate, and the through hole base plate (3) is a base plate washed and dried after drilling through holes without being subjected to a desmearing treatment.

The invention is described in more detail below.

Resin Articles Having Heat Deformation Temperature Higher Than 165° C.

The resin article (1) having a heat deformation temperature higher than 165° C. is moldings, films, sheets, laminates, etc., produced using fiber-reinforced or unreinforced thermoplastic resins, super heat-resistant thermoplastic resins, or thermosetting resins.

The heat deformation temperature in this invention is a critical temperature that when the article is kept at the predetermined temperature of at least 165° C., the article is deformed to an extent of practically unusable. The heat deformation temperature changes according to the residual stress of the resin article, the presence or absence and the kind of reinforcing fibers, etc., and the criterion thereof is a heat distortion temperature under a load of 4.64 kg/cm$^2$.

The heat resistant or super heat resistant thermoplastic resins for producing resin articles for use in this invention are general engineering plastics, e.g., polyamide resins such as nylon-6, nylon-6,6, nylon-6/66, nylon-11, nylon-3, and MXD6, MXD6/10, etc., induced from m-xylenediamine and aliphatic carboxylic acids and crystalline polyester resins such as polybutylene terephthalate, polyethylene terephthalate, etc.; and heat resistant or super heat resistant engineering plastics, e.g., all aromatic polyesters composed of polyethylene-2,6-naphthalate, polyoxybenzoyl polyester, p-hydroxybenzoic acid, phthalic acid, bisphenol, etc., as the main monomers and aromatic polyester liquid crystal polymers formed by grafting polyethylene terephthalate, etc., to the above all aromatic polyesters and polyetherimide, polysulfone, polysulphone, polyethersulphone, polyether ether ketone, polyphenylene ether, polyphenylene sulfide polyimide, polybenzimidazole, all aromatic polyamides, etc.

In these resins, the resins having a heat deformation temperature of at least 180° C. are preferred, and in particular, the general engineering plastics are usually preferably used as the fiber-reinforced resin compositions.

Examples of the thermosetting resins are thermosetting resins such as phenol resins, diallyl phthalate resins, epoxy resins, polyamine-bismaleimide resins, polymaleimide-epoxy resins, polymaleimide-isocyanate resins, cyanato resins, cyanato-epoxy resins, cyanato-polymaleimide resins, cyanato-epoxy-polymaleimide resins, etc.; so-called thermosetting "IPN" prepared by blending the thermosetting resins and an engineering plastic such as polyamide (nylon), aromatic polyester, polyetherimide, polyether ether ketone, polysulphone, polyphenylene ether, etc., and further added with a proper catalyst; polyolefins such as polyethylene, etc.; cross-linking thermosetting resins formed by blending a resin such as 1,2-polybutadiene with an organic peroxide as a crosslinking agent, a proper radical polymerizable polyfunctional compound, a thermosetting resin, etc.; and the resins blended with a filler such as glass, carbon, alumina, fibers, fibrous woven fabrics, powders, etc.

The resin article having a heat deformation temperature higher than 165° C. is formed using the above resin. First, the fiber-reinforced or unreinforced heat resistant molding [hereinafter referred to as "molding (1)"] is a steric article usually obtained by a molding method such as injection molding, transfer molding, compression molding, etc., using the above resin and, in particular, an injection molded product which was subjected to an anneal treatment to reduce the residual stress and accelerate the crystallization is suitably used in this invention.

The base plate selected from a heat resistant resin film or sheet (2-1) or a thermosetting resin laminate (2—2) [hereinafter referred to as "base plate (2)"] is a film or sheet (2-1) produced by extrusion molding, press molding, a casting method, or a cast polycondensation method using the above resin or a laminate (2—2) having an insulating layer formed by compounding the above resin as a matrix resin and a base material such as papers, glass fiber (various glass fibers of E,D,S,SII,T, quartz, etc.) woven or non-woven fabrics; woven or non-woven fabrics or porous sheets composed of heat resistant engineering plastic fibers (such as all aromatic polyamide, polyphenylene sulfide, polyether ether ketone, polyether imide, polytetrafluoroethylene, etc.), and composite fabrics of the above fabrics and the base plate are usually produced by a multiopening press, a continuous press, etc.

For the film or sheet (2-1), a super heat resistant resin such as polyimide, etc., is suitable, and for the laminate (2—2), a soldering heat resistance, etc., are usually required. The laminate (2—2) can be suitably used without any specific restriction. In the case of producing a through hole plated base plate, it is preferred that after subjecting the base plate to an annealing treatment, etc., to improve the dimensional stability in the range that the dimensional change at a temperature of at least 165° C., and preferably at least 180° C., is substantially allowed, e.g., a dimensional change ratio of 0.3% or less, preferably 0.1% or less, and more preferably 0.05% or less, through holes are formed at predetermined through hole positions.

The copper clad board (3-1) or the multilayer plate having printed wiring in the inside layer (3-2) for use as the through hole base plate by forming (drilling) a number of through holes [hereinafter referred to as "through hole base plate (3)"] is usually a copper clad board (3-1) formed by applying a copper foil to both surfaces of the base plate or a multilayer plate having printed wiring in the inside layer (3-2) for forming a number of through holes (usually from about 10,000 to 50,000/m$^2$) at the desired through hole positions of a printed wiring pattern. In these cases, a resin smear usually forms at the formation of through holes, but in the case of the copper clad laminate and multilayer printed wiring board, it is unnecessary to apply a treatment of removing the resin smear (de-smearing treatment).

The resin articles such as moldings (1), base plates (2), through hole base plates (3), etc., for use in this invention, have, attached on the surface, a release agent, a plasticizer, other additives for improving the moldability and releasability, and water. In particular, according to the natures of additives, the adhesive property of the copper layer is greatly deteriorated. Thus, in this invention, the resin article is subjected to a surface cleaning using a cleaning solution, considering the kind of the resin and the kinds of the additives. Examples of the cleaning solution are an acid or alkaline aqueous solution of a degreasing agent, a volatile organic solvent solution containing a volatile organic solvent and an acid or an alkali, etc., and it is preferred to perform the cleaning treatment in the range of scarcely changing the surface state of the resin article using, preferably a solution of a component by which the resin will be eroded by a severe condition such as high temperature, high concentration or a long time treatment, at a low temperature, a low concentration or for a short period of time. For example, in the case of a resin article having a lustrous surface, the resin article is subjected to the surface cleaning treatment under a condition of not loosing luster by visual observation. In addition, as the surface cleaning treatment, a method of applying, for example, a plasma treatment and immediately thereafter applying a plating treatment, which is usually employed for a vapor deposition method, etc., may be used, but since such a method is inferior in equipment and operation, there is no particular need of using such a method in this invention.

Copper Formate

Copper formate for use in this invention is a cupric formate compound such as anhydrous cupric formate, cupric formate tetrahydrate, and a mixture thereof, but a fine powder of anhydrous cupric formate is preferably used.

The amount of copper formate (total amount of copper formate disposed) is mainly determined according to the sum of the whole surface area of the resin article to be plated, the whole surface area of the vessel or the disposing mean for the resin articles, and the surface area of the apparatus for plating (the area of the inside wall of a vessel for heating means, etc.), and is at least 0.001 g/cm$^2$, preferably from 0.002 to 0.3 g/cm$^2$, and more preferably from 0.002 to 0.1 g/cm$^2$. When the resin article plated and copper formate are separately disposed or held, the distance between them is preferably within 5 cm, and more preferably within 2 cm, for applying uniform plating.

Treatment Process

As a heating means, radiation heating such as infrared heating, electron beam heating, microwave heating, etc., or other means such as an electric furnace, an oven, oil heating, compression vapor heating, a nichrome heating wire, etc., can be properly used. The heating system may be a batch system or a semicontinuous or continuous heating system having an introducing portion for resin articles to be plated, a plating portion, and taking out portion for the plated article. When the heat treatment temperature is near the heat deformation temperature of the resin article, a heating means giving a small scatter in temperature is preferred since if there is a large scatter in temperature, the resin article is deformed by the temperature scatter and becomes practical unusable. Further, it is preferred for practical use to increase the temperature raising rate and shorten the plating time for forming good copper layer or film. In this case, a process of previously heating the resin article to a temperature of 130° C. or less and then introducing the resin article to a heating means having a hot plate having a predetermined temperature as a heating means, a process of using far infrared ceramic heaters, or a process of combining the above process can be used, and in particular, the process of using a far infrared heating can heat the plating surface with a good efficiency.

The heating temperature is kept at a predetermined temperature in the range of at least 165° C. and below the heat deformation temperature of the molding under a substantially non-oxidative atmosphere and is preferably a predetermined temperature in the range of from 170° to 300° C. and below the heat deformation temperature of the molding.

On the other hand, copper formate is heated at a temperature raising rate of at least 1° C./min, preferably from 1° to 50° C./min, and more preferably from 2° to 35° C./min, in the temperature range of from 130° C. to 165° C., and is kept at the predetermined temperature. If the temperature raising rate of copper formate in the temperature range of from 130° C. to 165° C. is less than 1° C./min, the plated layer obtained becomes heterogeneous, the adhesive strength is poor, and further the amount of a copper powder formed is liable to be increased. A too high temperature raising rate gives no particular problem on the formation of the plated layer, but is not preferred since in such a case, the plated layer is liable to become heterogeneous.

Examples of a method of obtaining a non-oxidative atmosphere are a method of introducing a gas such as $N_2$, Ar, $CO_2$, CO, $H_2$, etc., and a method of reducing the inside volume of the heating means containing the molding to fill the inside thereof with substantially the decomposition gas of copper formate. In particular, in the case of using a continuous heating system, the inside of the heating system is easily filled with the decomposition gas of copper formate without using an inert gas by reducing the opening areas of an inlet to the heating zone and an outlet therefrom.

Examples of a method of obtaining reduced pressure are a method of using a heating means capable of reducing pressure, a method of placing the resin article plated in a vessel capable of reducing pressure and reducing the pressure in the inside only of the vessel, and a method of using a continuous heating system and disposing a reduced pressure chamber capable of pre-heating at the inlet portion of the resin article and a reduced pressure chamber capable of properly cooling at the portion of taking out the resin article. The reduced pressure is 30 Torr or less and preferably 5 Torr or less. In this invention, the employment of reduced pressure is preferred since in this case, a copper plated layer having excellent luster and good adhesive property is formed.

Post Treatment of Copper-Plated Resin Article

After the heat treatment by the method described above, the plated product is cooled to room temperature to provide a copper-plated resin article having copper plating at the desired portions. In addition, when the resin article is coated with copper formate at plating, a copper powder formed from copper formate which did not take part in the formation of the plated layer is usually left on the article attached thereto, but the copper powder can be easily removed by lightly wiping the resin article by blowing air thereto or other means. The inside wall of the heating means, the surfaces of the vessel or the disposing means, etc., used are copper-plated, but since the thickness of the plated layer formed per once is thin, the above means can be re-used as they are without removing the plated copper layer.

The copper-plated molding thus taken out is, if necessary, subjected to a known rust preventive treatment and is further subjected to a post treatment by plating or other method according to the kind of the copper-plated resin article to provide a product for practical use.

For further plating the copper-plated resin article obtained by the process of this invention, electroless plating or electroplating of a metal such as copper, nickel, gold, etc., is properly selected according to the need.

In the case of applying copper electroplating, it is preferred from the standpoint of inhibiting the occurrence of the reduction in adhesive strength by the micro-area concentration of plating stress to perform the plating in the range of the plating rate of 0.1 $\mu$m/sec. or lower, and preferably from 0.003 to 0.05 $\mu$m/sec until thickness of the copper layer becomes 5 $\mu$m or more, and after finishing plating, the residual stress is removed by applying, if necessary, an annealing treatment, etc.

When the copper-plated resin article produced by the above process of this invention is subjected to copper electroplating at a copper layer thickness of about 10 $\mu$m, the peeling strength of the copper foil shows a value of 0.4 kg/cm or higher, preferably 0.5 kg/cm or higher, and more preferably about 0.8 kg/cm or higher.

Then, preferred production methods are explained below according to the kind of the resin articles.

Production Process of Copper-Plated Molding

In a preferred process of producing a copper-plated resin molding from a molding (1), that is, a fiber-reinforced or unreinforced heat resistant resin molding having a heat deformation temperature higher than 165° C. in the process of this invention, the molding (1) and copper formate are heated under a reduced pressure of 30 Torr or less, and preferably 5 Torr or less in such a manner that the molding (1) is heated to a predetermined temperature in the range of at least 165° C., and preferably at least 170° C., and lower than the heat deformation temperature of the resin molding, and copper formate is temperature-raised at a rate of at least 1° C./min in the temperature range of from at least 130° C. to 165° C., kept at the predetermined temperature, and taken out from the system.

In this case, the employment of reduced pressure is preferred from the standpoint of forming a copper layer having a high adhesive strength.

For performing copper plating of the molding (1), there are a process of coating the desired portion of the molding with a solution or dispersion of copper formate and drying it at a temperature of 130° C. or less to attach thereto copper formate, followed by performing plating [hereinafter referred to as "coating process"] and a process of placing or holding the molding (1) and copper formate separately at an interval within 5 cm, and preferably within 2 cm, under a reduced pressure and performing plating (hereinafter referred to as "vapor deposition process"). A proper combination of these processes can also be properly used. According to the size of the molding (1), it is economically preferred to simultaneously performing plating of many moldings. Thus, it is preferred to prepare a vessel or a disposing means matching the form of the moldings (1) and the desired plating portions, and use a semi-continuous or continuous system having a preliminary reduced-pressure chamber, a reduced-pressure treatment chamber and taking out chamber, and intermittently or continuously introducing the vessel or disposing means containing therein or having disposed thereon many moldings (1) and copper formate into the reduced pressure treating chamber and taking out the vessel or the disposing means therefrom. A batch system may also be employed for performing plating of a number of moldings (1).

In the vapor deposition process, it is preferred in the point of forming a more uniform copper layer to dispose at least a part of copper formate on the inside surface of a lid for the vessel or on the disposing means. When copper plating is also applied to the contact portions of the moldings (1) with each other occurring in the case of disposing the moldings (1) in the vessel or on the disposing means or the contact portions of the moldings (1) with the vessel or the disposing means, copper formate is also disposed at the contact portions. In addition, the vapor deposition process is preferred from the point of the adhesive strength between the molding (1) and the copper layer formed, but there is a case that the molding (1) usually has complicated forms such as unevenness, holes, grooves, etc., and it takes much troubles to dispose anhydrous copper formate adjacent to the desired plating portions and in such a case, the coating process is suitably used.

There is no particular restriction on the material for the vessel or disposing means if the material can endure the treatment temperature, and metal, resins, etc., can be used as the material. A metal such as aluminum, iron, copper, etc., can be advantageously used. It is preferred that the shape of the vessel or the disposing means is properly selected according to the form of the moldings (1), the heating means, etc., such that plural moldings (1) are more compactly disposed and easily supplied and taken out, and subsidiary means for disposing and taking out the vessel or the disposing means are also properly used.

For disposing copper formate at the moldings (1), the vessel or disposing means for the moldings, and further the contact portions of the molding (1) and the vessel or the disposing means, a method of simply disposing a fine powder of copper formate as well as a method of applying thereto a solution of copper formate dissolving in a solvent which does not substantially react with copper formate and has a relatively low boiling point or a uniform dispersion of the copper formate powder by a coating means such as brush coating, dip coating, spray coating, bar coating, roll coating, etc. and drying the coating at a temperature of lower than the decomposition initiation temperature of copper formate, usually 130° C. or lower and particularly 110° C. or lower, or drying the coating at reduced pressure can be employed.

Examples of a suitable solvent or dispersing medium for preparing the copper formate solution or dispersion, are water, alcohols, aliphatic hydrocarbons, aromatic hydrocarbons, etc., having preferably a boiling point of 200° C. or lower. In particular, a dispersion prepared by kneading a fine powder of anhydrous cupric formate and a water free organic solvent such as heptane, hexane, cyclohexane, octane, propanol, butanol, heptanol, benzene, toluene, xylene, etc., is suitably used. In addition, the dispersion can be used by the same manner as a printing ink composition, etc., and in this case, a high-boiling solvent is used and after applying, the coating can be dried at a reduced pressure.

Copper formate may be attached to almost the whole desired surface, and presence of some scatter of coating gives no particular problem from a standpoint of plating. However, from the ratio of copper formate forming copper layer (filming ratio), it is preferred to coat more uniformly and thinly. In the case of applying copper plating to a part of the molding (1) but not to the whole surface thereof, the molding (1) is covered by a releasable resist, etc., at other portions than the desired portion, the dispersion or solution of copper formate is applied to the whole surface, and the resist is then released or is left as it is as the case may be.

Production Process of Copper Clad Base Plate

In the preferred embodiment of producing the copper-plated base plate using the base plate (2) for use in this invention selected from a heat resistant resin film or sheet (2—1) or a thermosetting resin laminate (2—2) each having a heat deformation temperature higher than 165° C., the base plate (2) and copper formate are disposed or held at an interval within 5 cm, and preferably within 2 cm and are heated in such a manner that the base plate (2) is heated to a predetermined temperature in the range of at least 165° C. and lower than the heat deformation temperature of the base plate (2) and copper formate is temperature-raised at a rate of 1° C./min or more in the temperature range of at least from 30° C. to 165° C. and kept at the predetermined temperature under a reduced pressure of 30 Torr or less, and preferably 5 Torr or less.

The thickness of the copper layer for the copper-plated base plate can be thicker than about 10 μm, but is preferred to form a copper clad base plate having a closely adhered uniform copper layer having a thickness of from 0.1 to 5 μm, and preferably from 0.2 to 3 μm and, if a thick copper layer is required, the thickness of the copper layer is further thickened by copper electroplating, etc.

The processing system may be a semi-continuous system or a continuous system but in particular, in the case of plating long articles, a continuous system is preferred. Copper plating can be applied to one surface or both surface of the base plate, or simultaneously to holes thereof, but in the case of forming a copper layer on both surfaces thereof and holes, it is preferred from the point of inhibiting the occurrence of staining of the surface of the base plate by the copper powder by-produced during the plating that the base plate is perpendicularly disposed.

The introduction of copper formate is suitably selected according to the kind of the base plate (2). The continuous system is performed by a process of disposing cupric formate on a continuous belt. There are a process of coating a uniform dispersion of the fine powder of anhydrous copper formate on a continuous belt, followed by drying, and a process of using a one surface uneven belt having uneven portions such as a large number of small cavities and/or grooves on one surface (copper formate disposing surface) or having a net or a cloth attached to the surface as the continuous belt and applying a copper formate powder to the cavities, grooves, or stitches thereof.

The copper clad base plate having a copper layer having a thickness of from 0.1 to 5 μm closely attached thereto including the inside walls of holes, etc., produced by the above production process is subjected to an ordinary rust preventing treatment and may be used as it is as a base plate of printed wiring, etc., but usually, in the case of using as a base plate for printed wiring, the thickness of the printed wiring copper foil or layer is increased to a thickness of from 5 μm to 70 μm, and preferably from 8 to 35 μm by a method of forming a masking resist pattern for the desired printed wiring pattern on copper-plated base plate and after applying thereto copper plating to increase the thickness of the copper foil, lightly etching (a flash etching method or a plating resist method) or a method of applying copper plating to the copper-plated base plate to increase the thickness of the copper foil or layer, forming thereon a resist pattern, and then etching the uncovered copper layer to form printed wiring (an etching resist method). It is preferred for improving the adhesive strength to apply thereto an annealing treatment for removing plating stress.

Production Process of Plated Through Hole Material

In a preferred process of producing a plated through hole material from the through hole base plate (3) produced by the process of this invention, that is, a copper clad base plate prepared by forming a large number of through holes in the copper clad board or a multilayer plate having printed wiring in the inside layer each having a heat deformation temperature higher than 165° C., copper formate is disposed or held at a position within 5 cm, preferably within 2 cm, and particularly preferably within 1 cm of the through holes, under a reduced pressure of 30 Torr or less, preferably 5 Torr or less, the through hole base plate is heated to a predetermined temperature in the range of at least 165° C. and lower than the heat deformation temperature of the through hole base plate (3), and capper formate is temperature-raised at a rate of 1° C./min in the range of at least from 130° C. to 165° C., thereby forming a copper layer having a thickness of 0.1 μm or more on the through hole walls.

As the treatment method, a batch system, a semi-continuous system, or a continuous system can be selected according to the kind of the through hole base plate (3). In particular, in the case of applying through hole plating to a multilayer oriented wiring board having many interlayers and having through holes of large aspect ratio, it is preferred to employ a manner of disposing copper formate in the holes or a manner of forcibly passing the vapor of copper formate through the holes. For example, an example of the method of disposing copper formate in the holes is a method of applying copper formate to the through hole base plate by brush coating, screen printing, roll coating or other means, squeezing copper formate into the holes by roll, squeezee or the like, removing copper formate on the surface of the base plate and drying. Representative examples of a manner of forcibly passing the vapor of copper formate through the holes are a method of holding copper formate in the holes of a plate having a number of perforations, and superposing the plate on a through hole base plate; a method of superposing the through hole base plate (3) on a plate having thinly coated or spread thereon copper formate through a thin separating piece at least the peripheral portions thereof; a method of stretching yarns having one-half or less diameter of that of the through hole in parallel as the separating piece in the inner portion; a method of stretching a net having an area or a diameter of the joint portions of one-half or less of the diameter of the through hole; and the like. In any cases, a horizontal arrangement or a vertical arrangement is appropriately selected.

In through hole plating in this invention, desmear is performed together with plating according to the kind of the matrix resin for the through hole base plate (3) and when a matrix resin containing 30% by weight or more of epoxy resin is used, desmear is performed together with through hole plating, thereby making it possible to produce a through hole plating base plate without performing desmear treatment after the drilling of through holes. Thus, the process of this invention is very suitable.

The through hole plating base plate produced by the process of this invention can be used for the subsequent production step of printed wiring plates or boards as in the case of through hole base plates by a conventional electroless plating.

In addition, from only the standpoint of plating in the through holes, plating is possible by applying a dispersion of anhydrous cupric formate to the through hole base plate (3) and heat-treating the base plate (3) under a reduced pressure, but in this case, a copper powder formed from anhydrous cupric formate which did not take part in the formation of the cupric layer exists on the coated portion of anhydrous copper formate and hence a step of removing the copper powder is required.

EXPLANATION OF THE DRAWINGS

Examples of apparatus for performing the production process of this invention are explained by the accompanying drawings.

FIG. 1 is an example showing an apparatus of performing copper plating by the semi-continuous process of this invention.

The apparatus shown in FIG. 1 is composed of a reduced-pressure plating chamber (A), a preliminary vacuum chamber (B) for inlet, and a preliminary vacuum chamber (C) for take out. The reduced-pressure plating chamber (A) is equipped with a lower heating means (H1), an upper heating means (H2) capable of controlling the vertical position thereof according to an article to be plated in the inside, and vacuum shutters (V1 and V2). The preliminary vacuum chambers (B and C) equipped with means (T1 and T2) for introducing an article plated into the plating chamber and taking out the article therefrom, respectively. These chambers (A, B, and C) are connected to a vacuum pump for reducing pressure by pipes and can be kept at desired reduced pressure. In addition, in each of the preliminary vacuum chambers (B and C) is properly placed a preliminary heating means or cooling means, respectively.

The apparatus shown in FIG. 1 is suitably used for plating a molding (1), one surface of a base plate (2) such as a film, sheet, laminate, etc., having a definite size or one surface and inside walls of holes of a through hole base plate (3). Then, an embodiment of the production is explained on a through hole base plate (3) having holes of a high aspect ratio.

On marginal portions of an aluminum plate having the same size as that of the through hole base plate and a thickness of 1 mm are formed fixing portions for aluminum separator, and the whole surface of one surface thereof is coated with anhydrous cupric formate, followed by drying. To the aluminum plate is fixed an aluminum separator having a shape corresponding to the marginal portions of the through hole base plate and having pins of slightly smaller than a standard hole at the positions corresponding to standard holes, the pins are inserted into the standard holes of the through hole base plate (3) to provide an integrated assembly, and the assembly thus formed is used for the production of a plated through hole material.

The door in the preliminary vacuum chamber (B) is opened, the assembly is introduced therein, and after closing the door, the chamber is evacuated. When the pressure reaches a predetermined vacuum, the vacuum shutter (V1) of the reduced-pressure plating chamber (A) heated to a predetermined temperature is opened and the assembly is introduced into the vacuum plating chamber (A) by the inlet means (T1). In the chamber, copper formate is evaporated or sublimed and is diffused into the vacuum pump side while passing through the holes. In this case, copper formate struck onto the walls of the holes is decomposed to form a copper layer and at the same time form a formic acid gas and a formic acid decomposition gas. In this case, when a smear resin is an epoxy resin, etc., smear, etc., is removed together by decomposition. During the treatment, a next through hole base plate is introduced into the preliminary vacuum chamber (B) and is on standby for the introduction into the reduced-pressure plating chamber (A). After finishing the desired plating treatment, the vacuum shutter (V2) is opened, the assembly is taken out from the vaccum plating chamber (A) by the taking out means (T2), and then the vacuum shutter (V2) is closed. The plated through hole material thus obtained is, if necessary, cooled and taken out from the chamber (C). Then, a next assembly is introduced into the vacuum plating chamber (A).

Figure 2:
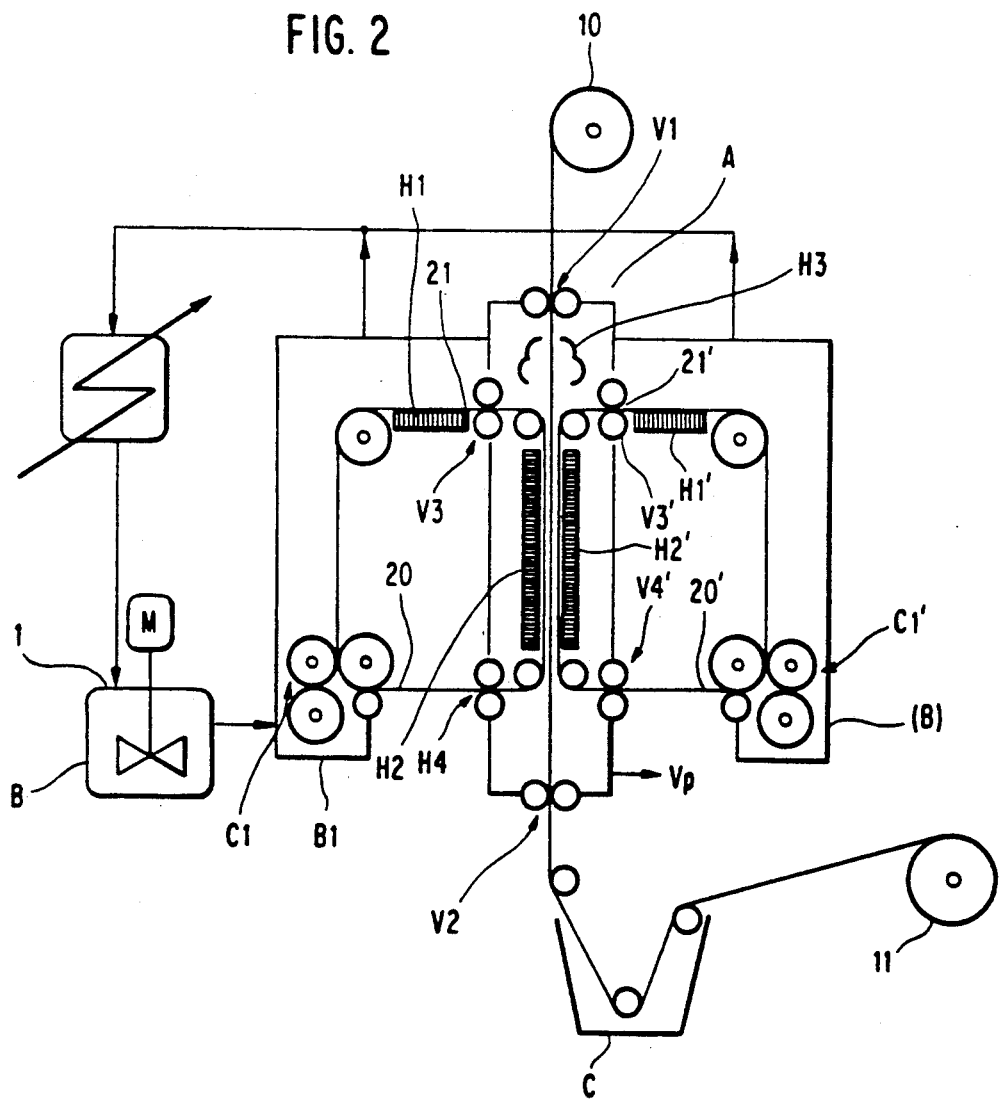
FIG. 2 is a schematic view showing an example of an apparatus for performing copper plating of copper rad boards or through hole base plates by the continuous process of this invention.

The apparatus shown in FIG. 2 is equipped with a reduced-pressure plating chamber (A) capable of reducing the pressure thereof by vacuum rolls (V1 to V4') and plating a base plate or a through hole base plate (2) by heat-treating the base plate or the through hole base plate and a belt having attached thereto copper formate with an interval of about 5 cm or less, means for attaching copper formate to the belts (20 and 20') and supplying the belt into the reduced-pressure plating chamber (A), and a post-treatment tank (C) for the plated copper clad base plate.

In the apparatus shown in FIG. 2, a polyimide sheet (10) having proper holes is introduced into the reduced-pressure plating chamber (A) through the vacuum roll (V1), wherein the sheet is heated to a predetermined temperature by a far infrared heater (H3). Also, copper formate coated belts (21 and 21') coated with a dispersion of anhydrous cupric formate by coating rolls (C1 and C1') and heated by heating means (H1 and H1'), respectively, are also introduced into the reduced-pressure plating chamber (A) by vacuum rolls (V3 and V3') and are held together with the above polyimide sheet 10 with a definite interval between heating means (H2 and H2'). Copper formate is heated to a predetermined temperature by the heating means (H2 and H2'), evaporated (or sublimed), decomposed on the polyimide sheet 10 to form copper, formic acid, and a reducing decomposition gas, and copper is deposited on the surface of the polyimide sheet and, if the sheet has holes, on the inside walls of the holes to form a copper layer thereon to provide a copper-plated polyimide sheet (11).

The copper-plated polyimide sheet (11) is taken out from the reduced-pressure plating chamber (A) through the vacuum roll (V2), subjected to a rust preventing treatment, an electroplating treatment, etc., in the post treatment tank (C), and, if necessary, subjected to an annealing treatment, followed by drying to provide a desired product.

On the other hand, the copper formate supplying belts (21 and 21') leave from the reduced-pressure plating chamber (A) through vacuum rolls (V4 and V4'), respectively, and after properly being cleaned to remove copper powders, etc., attached to the surface thereof, are coated with a copper formate solution in copper formate coating tanks (B1 and B1') by means of coating rolls (C1 and C1), respectively, followed by drying. The solvent vapor generated by drying is introduced into a cooling means, and condensed into liquid by cooling, and the liquid is uniformly mixed with a copper formate powder (1) in a tank (B) for preparing a copper formate solution or suspension, and circulated in the copper formate coating tanks (B1 and B1'). In addition, the waste gas from a vacuum pump is properly burned using a catalyst to convert the same into water and carbon dioxide gas, and discharged.

Figure 3:
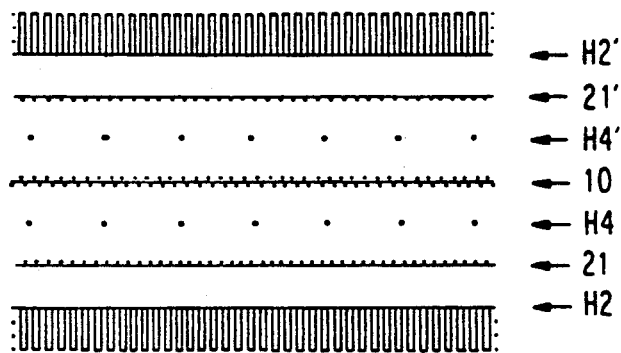
FIG. 3 is a schematic view showing an example of a heating method in the reduced-pressure plating chamber in FIG. 2.

FIG. 3 shows an example of the case of keeping the temperature of the polyimide sheet (10) in the reduced-pressure plating chamber shown in FIG. 2 higher than the temperature of the copper formate powder and a heating wire the surface of which is electrically insulated is inserted in a space between the copper formate coated belt 21 and the polyimide sheet 10.

Figure 4:
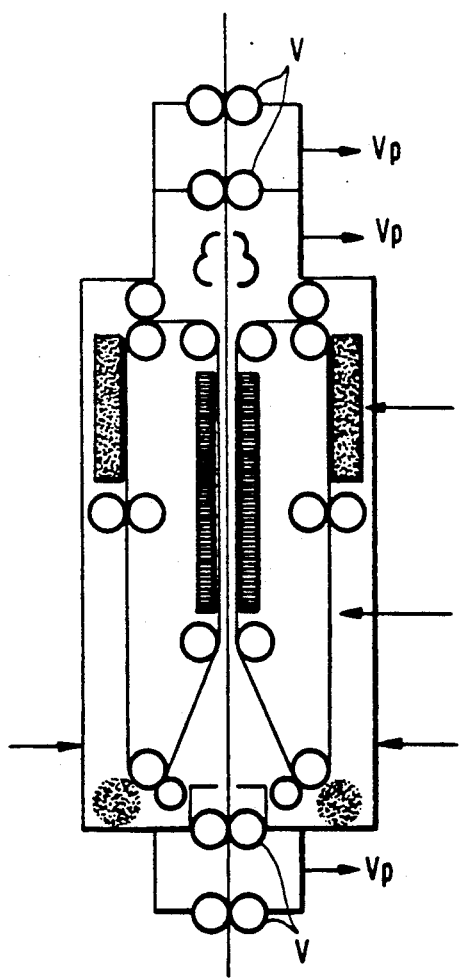
FIG. 4 is a schematic view showing an example of the reduced-pressure plating chamber in the case of supplying a copper formate powder in a state of being coated on uneven surface belts in FIG. 2.

FIG. 4 shows a case of forming double vacuum rolls (V) at the inlet and outlet for supplying one surface uneven belt having coated on the uneven surface a copper formate powder into a reduced-pressure plating chamber (A) and supplying base plates each having a definite size in place of a sheet (base plate) together with the belt in a state of being fixed thereto into the plating chamber (A) for plating.

Then, the invention is more practically explained by the following examples and comparison examples, wherein, unless otherwise indicated, the parts are by weight.

EXAMPLE 1

By kneading 100 parts of an anhydrous cupric formate powder and 50 parts of butyl alcohol, a dispersion of anhydrous cupric formate powder (hereinafter, the dispersion is referred to as "treatment liquid 1") was obtained.

A slightly curved frame molding for glasses, having a thickness of 3 mm, a width of 140 mm, and a height of 55 mm obtained by injection molding carbon fiber-reinforced nylon MXD6 formed from m-xylylenediamine and adipic acid was washed to a commercially available acid aqueous degreasing agent solution at 35° C. for 15 minutes and dried.

A box having a length of 200 mm, a breadth of 300 mm and a height of 60 mm made of aluminum equipped with cock-equipped nozzles for inletting and discharging gas at the side thereof, having fixed to the inside surface a comb-shaped member made by bending an aluminum sheet having a width of 40 mm and a thickness of 0.3 mm and having projections having a height of 10 mm with an interval of 13 mm, the comb-shape being a sectional face viewing from the perpendicular direction to the bend surface, and having a lid or cover having wire netting having formed thereon was prepared.

All the inside surfaces of the box including the lid were coated with the treatment liquid 1 and dried at 100° C. to dispose anhydrous cupric formate. The disposed amount of anhydrous cupric formate on the inside surface of the box including the surfaces of the subsidiary means was 140 g and that on the inside surface of the lid was 60 g.

In the above box were placed 30 frames for glasses and after blowing an $N_2$ gas into the box through the nozzle, the box was closed by the lid. After removing a pipe for $N_2$ gas blowing, the box was inserted between upper and lower heating plates in a heating chamber capable of evacuated and preheated to 230° C., the heating chamber was evacuated to few Torr, and they were kept as they were for 30 minutes. In addition, the temperature raising rate in the heating chamber was 7° C./min and the amount of anhydrous cupric formate per whole area in the inside surface of the box was 0.06 g/cm$^2$.

Then, the evacuation was stopped, and the box was taken out, and cooled to room temperature to provide copper-plated frames for glasses.

The frame for glasses obtained had a lustrous copper layer uniformly close-adhered to even the contact portions with the disposing means and the inside wall of the box, and there was no adhesion of copper-plated layer at the contact portions by continuation.

The thickness of the copper layer was 0.2 to 0.5 μm, the surface resistance was 0.05 to 0.5 Ω/□, and the result of cross cut test using an adhesive tape was 100/100. When the frames were subjected to copper electroplating, uniformly lustrous copper-plated frames for glasses were obtained.

EXAMPLE 2

By following the same procedure as in Example 1 except for not evacuating the heating chamber, uniformly copper-plated glass frames as in Example 1 were obtained.

EXAMPLE 3

By following the same procedure as in Example 1 except that a saturated aqueous solution of copper formate was used in place of the treatment liquid 1, copper-plated frames for glasses were obtained. In addition, the thickness of copper plating was 0.2 to 0.7 μm and the appearance was somewhat ununiform.

EXAMPLE 4

By following the same procedure as in Example 1 except that gears each having a diameter of about 35 mm and a height of about 10 mm were used in place of the frames for glasses and a wire net of about 40 mm square fixed to the bottom of the box was used as the disposing means, copper-plated gears were obtained. The thickness of the copper plating of the copper-plated gears obtained was 0.2 to 0.5 μm.

EXAMPLE 5

Moldings made of the resin shown below, having square grooves of 2 mm and 1 mm in width, V-shaped grooves, and drilled holes of 3 mm, 1 mm, and 0.6 mm, in diameter on one surface thereof, another surface being flat, were washed by a commercially available acid or alkaline aqueous degreasing agent solution at a temperature of from 30° to 60° C. for 10 to 20 minutes according to the kind or nature of the resin, and then dried.

(1) Molding 1: Carbon fiber-reinforced Nylon MXD6 made from m-xylylenediamine and adipic acid (Reny C36, trade name, made by Mitsubishi Gas Chemical Company, Inc.).

(2) Molding 2: Glass fiber-reinforced Nylon MXD6 made from m-xylylenediamine and adipic acid (Reny E-40, trade name, made by Mitsubishi Gas Chemical Company, Inc.).

(3) Molding 3: Carbon fiber-reinforced Nylon 6/66 copolymer.

(4) Molding 4: Polyarylate (U Polymer, trade name, made by UNITIKA Ltd.).

(5) Molding 5: Polysulphone (Udel Polysalfone, trade name, made by Amoco Chemicals, Co.).

(6) Molding 6: 20% by weight glass fiber-reinforced polyethersulphone (made by Mitsui Toatsu Chemicals, Inc.).

(7) Molding 7: Polyetherimide (Ultem, trade name, made by General Electric Co.).

(8) Molding 8: Polyether ether ketone (Victorex, trade name, made by Imperial Chemical Industries Limited).

(9) Molding 9: Glass fiber-reinforced polyethylene terephthalate resin.

(10) Molding 10: Glass fiber-reinforced polycarbonate resin (Iupiron, trade name, made by Mitsubishi Gas Chemical Company, Inc.).

(11) Molding 11: Glass fiber-reinforced polyphenylene sulfide resin.

A disposing means having a comb-shaped cross section having an interval of 13 mm and a height of 20 mm viewing from the perpendicular direction to the bent surface was prepared by bending an aluminum sheet having a width of 40 mm and a thickness of 0.3 mm and was fixed in the box in place of the subsidiary means used in Example 1.

By following the same manner as in Example 1 using the above box, anhydrous cupric formate was disposed. The disposed amount of anhydrous cupric formate on the inside surface of the box including the surface of the disposing means was 165 g and that on the inside surface of the lid of the box was 60 g.

The above moldings were disposed in the box and plated under the conditions described in Table 1 below. The results obtained are shown in Table 1.

EXAMPLE 6

By following the same procedure as in Example 5 except that moldings of the following thermosetting resin were used in place of the moldings 1 to 11, copper-plated thermosetting resin moldings were prepared. The results are shown in Table 1.

(12) Molding 12: Glass fiber-reinforced epoxy resin (made by Mitsubishi Gas Chemical Company, Inc.).

(13) Molding 13: Glass fiber-reinforced product using a tetra-functional epoxy resin synthesized from xylylenediamine and epichlorohydrin (Tetrad X, trade name, made by Mitsubishi Gas Chemical Company, Inc.).

(14) Molding 14: Carbon fiber-reinforced cyanato-maleimide-epoxy resin (made by Mitsubishi Gas Chemical Company, Inc.).

In the Table below, the appearance of copper layer is by visual observation, wherein o shows the formation of lustrous uniformly close-adhered copper layer and D shows the occurrence of a deformation of the molding.

TABLE 1

| Molding No. | Treatment Condition | | | Appearance of Copper Layer |
|---|---|---|---|---|
| | Temperature-Raising Rate (deg/min) | Holding Temperature (°C.) | Holding Time (min) | |
| 1 | 6 | 170 | 20 | o |
| | 8 | 230 | 10 | o |
| 2 | 6 | 170 | 20 | o |
| | 8 | 230 | 10 | o |
| 3 | 6 | 170 | 20 | o |
| | 8 | 200 | 15 | o |
| 4 | 8 | 200 | 15 | o |
| | 8 | 230 | 10 | o |
| 5 | 6 | 170 | 20 | o |
| | 8 | 200 | 15 | o |
| 6 | 8 | 200 | 15 | o |
| | 8 | 220 | 10 | o |
| 7 | 8 | 200 | 15 | o |
| | 8 | 230 | 10 | o |
| 8 | 8 | 200 | 15 | o |
| | 8 | 230 | 10 | o |
| 9 | 6 | 170 | 20 | o |
| | 8 | 200 | 15 | D |
| 10 | 6 | 170 | 20 | o |
| | 8 | 200 | 15 | D |
| 11 | 6 | 170 | 20 | o |
| | 8 | 230 | 10 | o |
| 12 | 8 | 200 | 15 | o |
| | 8 | 230 | 10 | o |
| 13 | 6 | 190 | 15 | o |
| | 8 | 220 | 10 | o |
| 14 | 6 | 170 | 20 | o |
| | 8 | 230 | 10 | o |

EXAMPLE 7

Surface-cleaned frame moldings for glasses as in Example 1 were coated with the treating liquid 1 and dried at 100° C. to attach anhydrous cupric formate on the whole surface thereof. By following the same procedure as in Example 1 except that 30 anhydrous cupric formate-attached frames for glasses were disposed in the box containing no anhydrous cupric formate, copper-plated frames were obtained.

In the frames obtained, a copper layer was uniformly close-attached even to the contact portions of the frames each other and the contact portions of the frame and the inside wall of the box, there was no adhesion at the contact portions by the continuation of a copper plated layer, there was no formation of an excessive copper layer at the grooved portions, and there was no trace of carbon fibers.

The thickness of the copper layer was 0.2 to 0.5 μm, the surface resistance was 0.05 to 0.5 Ω/□ and the result of the cross cut test using an adhesive tape was 100/100. When copper electroplating was applied to the frames for glasses, uniformly lustrous copper-plated frames were obtained.

EXAMPLE 8

By following the same procedure as in Example 7 except that the box placed in the heating chamber was closed by the lid while blowing a $N_2$ gas from the nozzle without evacuating the heating chamber, uniformly copper-plated frames for glasses as in Example 7 were obtained.

EXAMPLE 9

By following the same procedure as in Example 7 except that the treatment liquid 2 was used in place of the treatment liquid 1, wholly copper-plated frames for glasses were obtained. In addition, the thickness of copper plating was 0.2 to 1.0 μm and the appearance was somewhat ununiform.

EXAMPLE 10

By following the same procedure as in Example 7 except that gears having a diameter of about 35 mm and a height of about 10 mm were used in place of the frames, gears which were copper plated were obtained. The thickness of copper plating was 0.2 to 0.5 μm.

EXAMPLE 11

By following the same procedure as in Example 5 except that the surface-cleaned model moldings and the subsidiary means were dipped in the treatment liquid 1 and dried, and plating was performed under the condition shown in Table 2 below, copper-plated moldings were obtained. The results are shown in Table 2.

EXAMPLE 12

By following the same procedure as in Example 11 except that moldings (12) and (13) used in Example 6 were used in place of the moldings (1) to (10), the copper-plated moldings were obtained. The results are shown in Table 2.

TABLE 2

| Molding No. | Treatment Condition | | | |
|---|---|---|---|---|
| | Temperature-Raising Rate (deg/min) | Holding Temperature (°C.) | Holding Time (min) | Appearance of Copper Layer |
| 1 | 6 | 170 | 20 | c |
| | 8 | 230 | 10 | o |
| 2 | 6 | 170 | 20 | o |
| | 8 | 230 | 10 | o |
| 3 | 6 | 170 | 20 | o |
| | 8 | 200 | 15 | o |
| 4 | 8 | 200 | 15 | o |
| | 8 | 230 | 10 | o |
| 5 | 6 | 170 | 20 | o |
| | 8 | 200 | 15 | o |
| 6 | 8 | 200 | 15 | o |
| | 8 | 220 | 10 | o |
| 7 | 8 | 200 | 15 | o |
| | 8 | 230 | 10 | o |
| 8 | 8 | 200 | 15 | o |
| | 8 | 230 | 10 | o |
| 9 | 6 | 170 | 20 | o |
| | 8 | 200 | 15 | D |
| 10 | 6 | 170 | 20 | o |
| | 8 | 200 | 15 | D |
| 11 | 6 | 170 | 20 | o |
| | 8 | 230 | 10 | o |
| 12 | 8 | 200 | 15 | c |
| | 8 | 230 | 10 | o |
| 13 | 6 | 190 | 15 | o |
| | 8 | 220 | 10 | o |
| 14 | 6 | 170 | 20 | o |
| | 8 | 230 | 10 | o |

EXAMPLE 13

The treatment liquid 1 as used in Example 1 was prepared and the liquid was applied to one surface of an aluminum foil belt and dried to provide a copper formate-supply belt.

One surface of a polyimide sheet having a thickness of 50 μm (Kaptin, trade name, made by Toray.Du Pont Co.) was washed with an aqueous sodium hydroxide solution at 70° C. for 5 minutes and dried.

An apparatus equipped with a holding means, supplying means, and taking out means of the above polyimide sheet and copper formate-supply belt and a pair of heating plates horizontally disposed capable of passing the above polyimide sheet and the belt between them was used as the vessel capable of being evacuated, the polyimide sheet and the copper formate-supply belt were continuously introduced into the space between the heating plates and taken out therefrom to provide the copper-plated polyimide base plate.

In addition, the length of the heating zone of the heating plate was 40 cm, the pressure in the vessel was 0.1 to 1 Torr, the temperature of the heating plate was 280° C., the introducing rate of the polyimide sheet into the space between the heating plates was 5 cm/min, the speed of the copper formate-supply belt was 1.3 cm/min, the attached amount was 0.010 g/cm$^2$, the distance between the polyimide sheet and copper formate was 20 mm, and the temperature-raising rate of copper formate was 16° C./min between 130° C. and 165° C.

After finishing the plating of a definite length, the vessel was opened and cooled to room temperature, and the copper clad polyimide base plate was taken out.

The thickness of the copper layer was 0.7 μm and the surface resistance was 0.06 Ω/□.

The copper clad polyimide base plate was then subjected to copper electroplating to increase the thickness of the copper layer to 10 μm. When, after annealing the base plate at 200° C. for 30 minutes, the peeling strength of the copper layer was measured, the strength was 0.8 kg/cm. The copper-plated surface of the copper clad polyimide base plate was soldered to a copper plate and the peeling strength of the polyimide sheet was measured. In the test, the polyimide sheet teared to make difficult the measurement.

EXAMPLE 14

In Example 13, a polyether ether ketone film of 50 μm in thickness (TALPA 2000, trade name, made by Mitsui Toatsu Chemicals, Inc.) was used in place of the polyimide sheet and the film was washed by an aqueous solution of dichloroacetic acid at 80° C. for 10 minutes and dried. By following the same procedure as in Example 13, a one surface copper plated polyether ether ketone base plate was obtained.

The thickness of the copper layer was 1.0 μm and the surface resistance was 0.04 Ω/□.

When the thickness of the copper layer was increased to 10 μm by the same manner as in Example 13 and the peeling strength of the copper layer was measured, the strength was 0.8 g/cm.

EXAMPLE 15

The treatment liquid as used in Example 1 was prepared and applied to one surface of an aluminum foil of a definite length, followed by drying to provide a copper formate-supply belt.

Both surfaces of a polyimide sheet of 50 μm in length (Kapton, trade name, made by Toray.Du Pont Co.) were washed with an aqueous sodium hydroxide solution at 70° C. for 5 minutes and dried.

An apparatus equipped with a holding means, supplying means, and taking out means of the above polyimide sheet and copper formate-supply belts and having a pair of heating plates capable of passing the polyimide sheet and the two copper formate-supply belts through the space between the heating plates with the polyimide sheet at the center between the two copper formate-supply belts was used as the vessel capable of being evacuated and the polyimide sheet and the copper formate-supply belts were continuously supplied into the space between the heating plates and taken out therefrom to provide a copper clad polyimide base plate both the surfaces of which were copper-plated.

In addition, the length of the heating zone of the heating plate was 40 cm, the pressure in the vessel was 0.1 to 1 Torr, the temperature of the heating plates was 280° C., the introducing speed of the polyimide sheet into the space between the heating plates was 1.3 cm/min., the attached amount was 0.010 g/cm$^2$, the distance between the polyimide sheet and copper formate was 20 mm, and the temperature-raising rate of copper formate was 15° C./min between 130° C. and 165° C.

After finishing plating of a definite length, the vessel was opened and cooled to room temperature, and the copper clad polyimide base plate was taken out.

The thickness of the copper layer was 0.9 μm and the surface resistance was 0.06 Ω/□.

The copper clad polyimide base plate was subjected to copper electroplating to increase the thickness of the copper layer to 10 μm. When after annealing the base plate for 30 minutes at 200° C., the peeling strength of the copper layer was measured, the strength was 0.8 kg/cm.

EXAMPLE 16

In Example 15, a glass fiber-reinforced cyanato resin laminate having a thickness of 0.4 mm (laminate having no copper layer for Edolite CCL HL 810, trade name, made by Mitsubishi Gas Chemicals Company, Inc.) was used in place of the polyimide sheet and the laminate was washed with a commercially available aqueous degreasing agent solution at 60° C. for 10 minutes and then dried. By following the same procedure as in Example 15 except that 10 such laminates were connected by a joint made of polyimide at both ends and the temperature of the heating plates for plating was changed to 230° C., a copper clad base plate was obtained.

The thickness of the copper layer was 0.7 μm and the surface resistance was 0.06 Ω/□.

When the thickness of the copper layer was increased to 10 μm as in Example 15 and the adhesive strength of the copper layer was measured, the strength was 0.8 kg/cm.

EXAMPLE 17

The polyimide sheet (Kapton, trade name, made by Toray.Du Pont Co.) as used in Example 15 was heat-treated at 300° C. for 30 minutes and after forming perforations having a diameter of 0.4 mm at definite positions of 10 rows at an interval of 12.5 mm with 100 such perforations in one row at an interval of 1.25 mm, the sheet was washed by an aqueous sodium hydroxide solution and dried. By following the same procedure as in Example 15 using the polyimide sheet, a copper-plated through hole base plate of polyimide was obtained.

The thickness of the copper layer including that on the inside walls of the perforations was from 0.5 to 0.7 μm, the surface resistance was from 0.06 to 0.1 Ω/□, and the dimensional changing ratio among the perforations was 0.06%.

The copper-plated through hole base plate of polyimide was then subjected to copper electroplating to increase the thickness of the copper layer to 10 μm. When after annealing the base plate for 30 minutes at 200° C., the peeling strength of the copper layer was measured, the strength was 0.8 kg/cm.

EXAMPLE 18

In Example 17, a glass fiber-reinforced cyanato resin laminate having a thickness of 0.4 mm (laminate having no copper layer for Edolite CCL HL 810, trade name, made by Mitsubishi Gas Chemicals Company, Inc.) was subjected to a preliminary heat treatment at 230° C. for 30 minutes in place of the polyimide sheet. Perforations were formed as in Example 17, and the laminate was washed by a commercially available aqueous alkaline degreasing agent solution at 60° C. for 10 minutes and dried. By following the same procedure as in Example 17 except that 10 such laminates connected by a joint made of polyimide at both sides were used and the temperature of the heating plates was changed to 200° C., a copper-plated through hole base plate was obtained.

The thickness of the copper layer including that on the inside walls of the perforations was from 0.5 μm to 0.7 μm, the surface resistance was from 0.06 to 0.1 Ω/□, and the dimensional changing ratio among the perforations was 0.02%.

The thickness of the copper layer was then increased to 10 μm by the same manner as in Example 17 and when the adhesive strength of the copper layer was measured, the strength was 0.8 kg/cm.

EXAMPLE 19

A double face copper clad glass fiber-reinforced epoxy resin 4 layer plate having a thickness of 1.6 mm and an area of 300 mm×300 mm (made by Mitsubishi Gas Chemicals Company, Inc.) was used, and after forming perforations having a diameter of 0.35 mm at definite positions of 30 rows at an interval of 10 mm with 60 such perforations in one row at an interval of 5 mm, the plate was washed with an aqueous alkaline degreasing agent solution as used in Example 15 for 10 minutes at 60° C. and dried to provide a 4-layer plate having perforations.

The treatment liquid 1 was applied to one surface of an aluminum plate having the same size as that of the 4-layer perforated plate and dried to provide an aluminum plate having attached thereto about 0.02 g/cm$^2$ of anhydrous cupric formate.

An aluminum separator having a thickness of 1 mm and a width of 3 mm was disposed at the marginal portion of the aluminum plate, the 4-layer perforated plate was superposed on the aluminum plate, the assembly was disposed between the heating plates of a heating chamber pre-heated to 200° C., and after immediately evacuating the inside of the heating chamber to few Torr, the assembly was kept as it was for 30 minutes. In addition, the temperature-raising rate of anhydrous cupric formate was 16° C./min during a temperature of from 130° C. to 165° C.

After cooling the inside of the heating chamber to room temperature, air was introduced into the chamber, the 4-layer perforated plate was taken out, using the plate or after increasing the thickness of the copper layer by applying thereto copper electroplating, the perforations were sealed by a transparent liquid epoxy resin, the plate was cut, and the cut surface was observed by a microscope.

The result showed that a copper layer having a thickness of from 0.5 to 0.7 μm plated by copper formate was closely attached to the inside walls of the perforations and the copper layer portion of the inside layer, and the copper layer of the inside layer was completely close-adhered to the attached copper layer. Further, no resin layer was found between the copper layer of the inside layer and the plated copper layer and resin smear was completely removed.

EXAMPLE 20

A copper clad laminate having a thickness of 6 mm and having 2 copper layers in both outer layers and the inside layer was prepared using a glass unwoven fabric epoxy resin prepreg as a model multilayer plate.

Using the copper clad laminate, a plated through hole material having a hole diameter of 0.35 mm and an aspect ratio of about 17 was obtained in the same manner as in Example 19 except that the amount of copper formate used was 0.05 g/cm$^2$. and examined.

As a result, a copper layer having a thickness of 0.5 to 0.7 μm plated by copper formate was closely attached to the inside walls of the perforations and the copper layer portion of the inside layer, and the copper layer of the inside layer was completely closely adhered to the attached copper layer. Further, no resin layer was found between the copper layer of the inside layer and the plated copper layer, and resin smear was completely removed.

EXAMPLE 21

The same procedure as in Example 19 was followed except that a glass fiber-reinforced cyanato resin 4 layer plate (made by Mitsubishi Gas Chemical Company, Inc.) was used in place of the glass fiber-reinforced epoxy resin 4 layer plate.

As a result, a copper layer having a thickness of 0.5 to 0.7 μm plated by copper formate was closely attached to the inside walls of the perforations and the copper layer portion of the inside layer, and the copper layer of the inside layer was completely close adhered to the attached copper layer. Further, no resin layer was found between the copper layer of the inside layer and the plate copper layer, and resin smear was completely removed.

EXAMPLE 22

The same procedure as in Example 19 was followed except that a glass fiber-reinforced fluoro resin 4 layer plate was used in place of the glass fiber-reinforced epoxy resin 4 layer plate and the plating treatment was conducted at a temperature of 250° C.

As a result, a copper layer having a thickness of 0.5 to 0.7 μm plated by copper formate was closely attached to the inside walls of the perforations and the copper layer portion of the inside layer, and the copper layer of the inside layer was completely close adhered to the attached copper layer.

As described above, since the production process of this invention is substantially a dry process, a post-treatment, etc., are very easily applied. Further, by the treatment under a reduced pressure which can be easily attained as compared with a conventional dry process, etc., a resin article having formed thereon a copper layer having an excellent adhesive strength, which has never been attained by a conventional process, can be produced.

Further, according to the process of this invention, a resin article having formed thereon a copper layer having an excellent adhesive strength can be produced by a very simple means on the resin article that the formation of a copper layer having excellent adhesive strength on it has been difficult by electroless plating, etc., without applying a specific pre-treatment.

Onto the copper-plated resin article can be easily and uniformly applied plating of copper, nickel, chromium silver, gold, etc., by electroplating, electroless plating, etc., and hence the copper-plated resin article can be used as it is or as inexpensive subbing treatment for the above plated products.

Furthermore, in the process of this invention, a large amount of articles can be treated simultaneously and the plated layer formed shows an excellent adhesive strength (peeling strength) without having an adhesive layer. Accordingly, the process is useful for various materials such as polyether ether ketone moldings, films or sheets of a super heat resisting resin such as polyimide, etc., thermosetting resin laminates, and further for a field of through hole plating, etc., and thus the industrial significance of the process of this invention is very large.

While the invention has been described in detail and with reference to specific embodiments thereof, it will be apparent to one skilled in the art that various changes and modifications can be made therein without departing from the spirit and scope thereof.

What is claimed is:

1. A process of producing a copper-plated resin article by forming a copper layer strongly adhered to the resin article by a dry process, which comprises heating a resin article having a heat deformation temperature higher than 165° C. and a source of copper formate which consists of copper formate under a reduced pressure or in a non-oxidative atmosphere in such a manner that the resin article is heated to a predetermined temperature in the range of at least 165° C. and lower than the heat deformation temperature of the resin article and the copper formate is temperature-raised at a rate of at least 1° C./min in the temperature range of at least from 130° C. to 165° C. and kept of at a temperature of at least 165° C.

2. The process as claimed in claim 1, wherein said heating is in a plating zone and the amount of copper formate per the whole area of the plating ozone for heating the resin article and copper formate is at least 0.001 g/cm$^2$.

3. The process as claimed in claim 2, wherein the amount of copper formate is from 0.003 to 0.3 g/cm$^2$.

4. The process as claimed in claim 1, wherein the temperature raising rate of the source of copper formate in the temperature range of from 130° C. to 165° C. is from 1 to 50° C./min.

5. The process as claimed in claim 1, wherein the resin article and source of copper formate are kept at a temperature of at least 165° C. for from 1 to 60 minutes.

6. The process as claimed in claim 1, wherein the pressure is 30 Torr or less.

7. The process as claimed in claim 6, wherein the pressure is 5 Torr or less.

8. The process as claimed in claim 1, wherein the resin article is previously subjected to a surface cleaning treatment.

9. The process as claimed in claim 1, wherein the resin article and source of copper formate are continuously or intermittently supplied to a heating zone previously heated to a predetermined temperature and then taken out from the heating zone.

10. A process as claimed in claim 1, which further comprises succesively electrolytically plating the copper-plated resin article obtained.

11. The process as claimed in claim 10, wherein the electroplating is a copper electroplating and the plating is performed at a plating speed of 0.1 μm/sec. or less until the thickness of the copper layer becomes at least 5 μm.

12. The process as claimed in claim 10, wherein when the copper-plated resin article is electrolitically plated to increased the thickness of the copper layer to 10 μm, the copper layer peeling strength of the product is at least 0.4 kg/cm.

13. A process of producing a copper-plated molding, which comprises heating a fiber-reinforced or unreinforced heat-resistant resin molding (1) having a heat deformation temperature higher than 165° C. and a source of copper formate which consists of copper formate under a reduced pressure of 30 Torr or less in such a manner that the molding (1) is heated to a predetermined temperature in the range of 165° C. or more and lower than the heat deformation temperature of the molding, and copper formate is temperature-raised at a rate of at least 1° C./min in the range of at least from 130° C. to 165° C.

14. The process as claimed in claim 13, wherein the pressure is 5 Torr or less.

15. The process as claimed in claim 13, wherein the molding (1) is previously subjected to a surface cleaning treatment.

16. The process as claimed in claim 13, wherein said heating is in a plating zone and the amount of copper formate per whole area of the plating zone for heating the molding (1) and copper formate is at least 0.001 g/cm².

17. The process as claimed in claim 16, wherein the amount of copper formate is from 0.003 to 0.3 g/cm².

18. The process as claimed in claim 17, wherein the molding (1) is coated with a solution or a dispersion of the copper formate at a desired portion and dried at a temperature of 130° C. or less to attach the copper formate to the molding (1) and then heated to a predetermined temperature of 165° C. or more and lower than the heat deformation temperature of the resin.

19. The process as claimed in claim 18, wherein the dispersion is a dispersion of an anhydrous cupric formate fine powder dispersed in an organic solvent having a boiling point of 200° C. or less.

20. The process as claimed in claim 18, wherein the molding (1) and source of copper formate are heated in a state that many moldings (1) having attached thereto the source of copper formate are placed in a vessel in which said heating takes place.

21. The process as claimed in claim 13, wherein the molding (1) and source of copper formate are heated while they are separately disposed while holding the source of copper formate at a position within 5 cm of the molding, the heating being under a reduced pressure.

22. The process as claimed in claim 21, wherein the pressure is 5 Torr or less.

23. The process as claimed in claim 21, wherein many moldings (1) are placed in a vessel in which said heating takes place and the source of copper formate is disposed on the inside surface of a lid of said vessel.

24. A process of producing a copper clad base plate having a copper layer of from 0.1 to 5 μm closely adhered thereto, which comprises holding a base plate (2) selected from a heat resistant resin film or sheet (2-1) having a heat deformation temperature higher than 165° C. and a thermosetting resin laminate (2—2) having a heat deformation temperature of at least 165° C. and a source of copper formate which consists of copper formate, the source of copper formate being held at a position within 5 cm of the base plate (2) and the source of copper formate and base plate (2) being under a reduced pressure of 30 Torr or less, heating the base plate (2) in a heating zone to a predetermined temperature in the range of at least 165° C. and lower than the heat deformation temperature of the base plate (2), and raising the temperature of the copper formate at a rate of at least 1° C./min in the temperature range of at least 130° C. to 165° C.

25. The process as claimed in claim 24, wherein the base plate (2) is previously subjected to a surface cleaning treatment.

26. The process as claimed in claim 24, wherein said heating is in a plating zone and the amount of copper formate per whole surface area of the plating zone for heating the base plate (2) and copper formate is at least 0.001 g/cm².

27. The process as claimed in claim 26, wherein the amount of copper formate is from 0.003 to 0.3 g/cm².

28. The process as claimed in claim 24, wherein the base plate (2) has a number of perforations formed as desired portions thereof.

29. The process as claimed in claim 24, wherein the base plate (2) is a polyimide film.

30. The process as claimed in claim 24, wherein the base plate (2) is a thermosetting resin laminate.

31. The process as claimed in claim 24, wherein the base plate (2) is continuously or intermittently supplied to the heating zone which has been pre-heated to a predetermined temperature.

32. A process of producing a plated through hole material having a copper layer of 0.1 μm or more closely adhered thereto, which comprises forming a large number of through holes in a copper clad plate or a multilayer board having printed wiring in an inside layer thereof, said plate and board each having a heat deformation temperature higher than 165° C. to form a through hole base plate (3), holding a source of copper formate which consists of copper formate at a position within 5 cm of the through holes at a reduced pressure of 30 Torr or less, heating the through hole base plate (3) in a heating zone to a predetermined temperature in the range of at least 165° C. and lower than the heat deformation temperature of the through hole base plate (3), and raising the temperature of the source of copper formate at a rate of at least 1° C./min up to the temperature range of at least from 130° C. to 165° C. and keeping the temperature of at least 165° C.

33. The process as claimed in claim 32, wherein the pressure is not higher than 5 Torr.

34. The process as claimed in claim 32, wherein a plurality of through hole base plates (3) are continuously or intermittently supplied to the heating zone which has been pre-heated to a predetermined temperature under a reduced pressure.

35. The process as claimed in claim 32, wherein the through hole base plate (3) and the source of copper formate are arranged such that the through hole base plate (3) is superposed on a plate having thinly coated thereon or spread thereover the source of copper formate and wherein the through hole base plate (3) and the plate are separated by a thin separating means at least at the periphery of the through hole base plate and the plate.

36. The process as claimed in claim 32, wherein the through hole base plate (3) is, after forming through holes, is subjected to a surface cleaning treatment without being subjected to a smear removing treatment.

37. The process as claimed in claim 18, wherein the molding (1) and the source of copper formate are heated in a state that many moldings (1) having attached thereto the copper formate are carried on a comb-shaped member.

38. The process as claimed in claim 21, wherein many moldings (1) are heated while carried on a comb-shaped member and the source of copper formate is disposed on the comb-shaped member.

39. A process of producing a copper-plated molding, which comprises heating a fiber-reinforced or unreinforced heat-resistant resin molding (1) having a heat deformation temperature higher than 165° C. and a source of copper formate which consists of copper formate under a reduced pressure of 30 Torr or less in such a manner that the molding (1) is heated to a predetermined temperature in the range of 165° C. or more and lower than the heat deformation temperature of the molding, and copper formate is temperature-raised at a rate of at least 1° C./min in the range of at least from 130° C. to 165° C. wherein the molding (1) and the source of copper formate are heated while they are separately disposed while holding the source of copper formate at a position within 5 cm of the molding, the heating being under reduced pressure, and further wherein at any portion where there is contact between the molding (1) with another molding (1), with a vessel in which the molding (1) is contained or with a carrying means in which the molding (1) is carried at the time of heating is coated with a source of copper formate.

* * * * *